US007427425B2

(12) United States Patent
Carpenter et al.

(10) Patent No.: US 7,427,425 B2
(45) Date of Patent: Sep. 23, 2008

(54) REACTORS WITH ISOLATED GAS CONNECTORS AND METHODS FOR DEPOSITING MATERIALS ONTO MICRO-DEVICE WORKPIECES

(75) Inventors: Craig M. Carpenter, Boise, ID (US); Ross S. Dando, Nampa, ID (US); Danny Dynka, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 464 days.

(21) Appl. No.: 10/932,470

(22) Filed: Sep. 1, 2004

(65) Prior Publication Data

US 2005/0028734 A1 Feb. 10, 2005

Related U.S. Application Data

(62) Division of application No. 10/365,085, filed on Feb. 11, 2003, now Pat. No. 6,926,775.

(51) Int. Cl.
C23C 16/00 (2006.01)
(52) U.S. Cl. .............................. 427/248.1; 427/255.23; 427/255.28
(58) Field of Classification Search ........................ None
See application file for complete search history.

(56) References Cited

U.S. PATENT DOCUMENTS

| 2,508,500 A | 5/1950 | de Lange |
| 3,522,836 A | 8/1970 | King |
| 3,618,919 A | 11/1971 | Beck |
| 4,289,061 A | 9/1981 | Emmett |
| 4,313,783 A | 2/1982 | Davies et al. |

(Continued)

FOREIGN PATENT DOCUMENTS

JP 62235728 10/1987

(Continued)

OTHER PUBLICATIONS

Aera Corporation, "Fundamentals of Mass Flow Control," 1 page, retrieved from the Internet on Mar. 6, 2003, <http://www.aeramfc.com/funda.shtml>.

(Continued)

*Primary Examiner*—Timothy Meeks
*Assistant Examiner*—Kelly M Stouffer
(74) *Attorney, Agent, or Firm*—Perkins Coie LLP

(57) ABSTRACT

Reactors having gas distributors for depositing materials onto micro-device workpieces, systems that include such reactors, and methods for depositing materials onto micro-device workpieces. In one embodiment, a reactor for depositing materials onto a micro-device workpiece includes a reaction chamber, a passageway, and a door assembly. The reaction chamber includes a gas distributor configured to provide a flow of gas(es) to a micro-device workpiece on a workpiece holder. The passageway, which has a first end open to the reaction chamber and a second end apart from the reaction chamber, is configured to provide ingression to and egression from the chamber for processing the micro-device workpiece. The door assembly is configured to open and sealably close a door at the second end of the passageway. A gas conditioning system positioned in the door is configured to maintain a desired concentration and phase of gas constituents in the passageway.

23 Claims, 5 Drawing Sheets

U.S. PATENT DOCUMENTS

| | | |
|---|---|---|
| 4,388,342 A | 6/1983 | Suzuki et al. |
| 4,436,674 A | 3/1984 | McMenamin |
| 4,438,724 A | 3/1984 | Doehler et al. |
| 4,509,456 A | 4/1985 | Kleinert et al. |
| 4,545,136 A | 10/1985 | Izu et al. |
| 4,593,644 A | 6/1986 | Hanak |
| 4,738,295 A | 4/1988 | Genser et al. |
| 4,780,178 A | 10/1988 | Yoshida et al. |
| 4,832,115 A | 5/1989 | Albers et al. |
| 4,871,417 A | 10/1989 | Nishizawa et al. |
| 4,894,132 A | 1/1990 | Tanaka |
| 4,911,638 A | 3/1990 | Bayne et al. |
| 4,923,715 A | 5/1990 | Matsuda et al. |
| 4,948,979 A | 8/1990 | Munakata et al. |
| 4,949,669 A | 8/1990 | Ishii et al. |
| 5,015,330 A | 5/1991 | Okumura et al. |
| 5,017,404 A | 5/1991 | Paquet et al. |
| 5,020,476 A | 6/1991 | Bay et al. |
| 5,062,446 A | 11/1991 | Anderson |
| 5,076,205 A | 12/1991 | Vowles et al. |
| 5,090,985 A | 2/1992 | Soubeyrand |
| 5,172,849 A | 12/1992 | Barten et al. |
| 5,223,113 A | 6/1993 | Kaneko et al. |
| 5,286,296 A * | 2/1994 | Sato et al. ................ 118/719 |
| 5,325,020 A | 6/1994 | Campbell et al. |
| 5,364,219 A | 11/1994 | Takahashi et al. |
| 5,366,557 A | 11/1994 | Yu |
| 5,433,787 A | 7/1995 | Suzuki et al. |
| 5,445,491 A | 8/1995 | Nakagawa et al. |
| 5,453,124 A | 9/1995 | Moslehi et al. |
| 5,474,612 A | 12/1995 | Sato et al. |
| 5,477,623 A | 12/1995 | Tomizawa et al. |
| 5,496,410 A | 3/1996 | Fukuda et al. |
| 5,498,292 A | 3/1996 | Ozaki |
| 5,532,190 A | 7/1996 | Goodyear et al. |
| 5,536,317 A | 7/1996 | Crain et al. |
| 5,562,800 A | 10/1996 | Kawamura et al. |
| 5,575,883 A | 11/1996 | Nishikawa et al. |
| 5,589,110 A | 12/1996 | Motoda et al. |
| 5,592,581 A | 1/1997 | Okase |
| 5,626,936 A | 5/1997 | Alderman |
| 5,640,751 A | 6/1997 | Faria |
| 5,683,538 A | 11/1997 | O'Neill et al. |
| 5,693,288 A | 12/1997 | Nakamura |
| 5,716,796 A | 2/1998 | Bull et al. |
| 5,733,375 A | 3/1998 | Fukuda et al. |
| 5,746,434 A | 5/1998 | Boyd et al. |
| 5,754,297 A | 5/1998 | Nulman |
| 5,766,364 A | 6/1998 | Ishida et al. |
| 5,769,950 A | 6/1998 | Takasu et al. |
| 5,769,952 A | 6/1998 | Asakawa |
| 5,772,771 A | 6/1998 | Li et al. |
| 5,803,938 A | 9/1998 | Yamaguchi et al. |
| 5,819,683 A | 10/1998 | Ikeda et al. |
| 5,820,641 A | 10/1998 | Gu et al. |
| 5,820,686 A | 10/1998 | Moore |
| 5,827,370 A | 10/1998 | Gu |
| 5,851,294 A | 12/1998 | Young et al. |
| 5,866,986 A | 2/1999 | Pennington |
| 5,868,159 A | 2/1999 | Loan et al. |
| 5,879,516 A | 3/1999 | Kasman |
| 5,885,425 A | 3/1999 | Hsieh et al. |
| 5,902,403 A | 5/1999 | Aitani et al. |
| 5,911,238 A | 6/1999 | Bump et al. |
| 5,936,829 A | 8/1999 | Moslehi |
| 5,940,684 A | 8/1999 | Shakuda et al. |
| 5,958,140 A | 9/1999 | Arami et al. |
| 5,961,775 A | 10/1999 | Fujimura et al. |
| 5,963,336 A | 10/1999 | McAndrew et al. |
| 5,997,588 A | 12/1999 | Goodwin et al. |
| 5,998,932 A | 12/1999 | Lenz |
| 6,006,694 A | 12/1999 | DeOrnellas et al. |
| 6,016,611 A | 1/2000 | White et al. |
| 6,022,483 A | 2/2000 | Aral |
| 6,039,557 A | 3/2000 | Unger et al. |
| 6,045,620 A | 4/2000 | Tepman et al. |
| 6,089,543 A | 7/2000 | Freerks |
| 6,090,210 A | 7/2000 | Ballance et al. |
| 6,113,698 A | 9/2000 | Raaijmakers et al. |
| 6,142,163 A | 11/2000 | McMillin et al. |
| 6,143,078 A | 11/2000 | Ishikawa et al. |
| 6,159,297 A | 12/2000 | Herchen et al. |
| 6,159,298 A | 12/2000 | Saito et al. |
| 6,174,366 B1 | 1/2001 | Ihantola |
| 6,178,660 B1 | 1/2001 | Emmi et al. |
| 6,183,563 B1 | 2/2001 | Choi et al. |
| 6,190,459 B1 | 2/2001 | Takeshita et al. |
| 6,192,827 B1 | 2/2001 | Homqing |
| 6,193,802 B1 | 2/2001 | Pang et al. |
| 6,194,628 B1 | 2/2001 | Pang et al. |
| 6,197,119 B1 | 3/2001 | Dozoretz et al. |
| 6,200,415 B1 | 3/2001 | Maraschin |
| 6,206,967 B1 | 3/2001 | Mak et al. |
| 6,207,937 B1 | 3/2001 | Stoddard et al. |
| 6,251,190 B1 | 6/2001 | Mak et al. |
| 6,255,222 B1 | 7/2001 | Xia et al. |
| 6,263,829 B1 | 7/2001 | Schneider et al. |
| 6,264,788 B1 | 7/2001 | Tomoyasu et al. |
| 6,273,954 B2 | 8/2001 | Nishikawa et al. |
| 6,277,757 B1 | 8/2001 | Lin et al. |
| 6,277,763 B1 | 8/2001 | Kugimiya et al. |
| 6,280,584 B1 | 8/2001 | Kumar et al. |
| 6,294,394 B1 | 9/2001 | Erickson et al. |
| 6,309,161 B1 | 10/2001 | Hofmeister |
| 6,328,803 B2 | 12/2001 | Rolfson et al. |
| 6,333,272 B1 | 12/2001 | McMillin et al. |
| 6,334,928 B1 | 1/2002 | Sekine et al. |
| 6,347,918 B1 | 2/2002 | Blahnik |
| 6,364,219 B1 | 4/2002 | Zimmerman et al. |
| 6,383,300 B1 | 5/2002 | Saito et al. |
| 6,402,806 B1 | 6/2002 | Schmitt et al. |
| 6,402,849 B2 | 6/2002 | Kwag et al. |
| 6,415,736 B1 | 7/2002 | Hao et al. |
| 6,425,168 B1 | 7/2002 | Takaku et al. |
| 6,486,081 B1 | 11/2002 | Ishikawa et al. |
| 6,506,254 B1 | 1/2003 | Bosch et al. |
| 6,508,268 B1 | 1/2003 | Kouketsu et al. |
| 6,541,353 B1 | 4/2003 | Sandhu et al. |
| 6,551,929 B1 | 4/2003 | Kori et al. |
| 6,562,141 B2 | 5/2003 | Clarke |
| 6,580,174 B2 | 6/2003 | McCormick et al. |
| 6,585,823 B1 | 7/2003 | Van Wijck |
| 6,593,644 B2 | 7/2003 | Chiu et al. |
| 6,602,346 B1 | 8/2003 | Gochberg et al. |
| 6,622,104 B2 | 9/2003 | Wang et al. |
| 6,638,672 B2 | 10/2003 | Deguchi |
| 6,663,713 B1 | 12/2003 | Robles et al. |
| 6,666,982 B2 | 12/2003 | Brcka |
| 6,673,196 B1 | 1/2004 | Oyabu |
| 6,689,220 B1 | 2/2004 | Nguyen |
| 6,770,145 B2 | 8/2004 | Saito et al. |
| 6,787,463 B2 | 9/2004 | Mardian et al. |
| 6,800,139 B1 | 10/2004 | Shinriki et al. |
| 6,800,172 B2 | 10/2004 | Carpenter et al. |
| 6,807,971 B2 | 10/2004 | Saito et al. |
| 6,814,813 B2 | 11/2004 | Dando et al. |
| 6,828,218 B2 | 12/2004 | Kim et al. |
| 6,830,652 B1 | 12/2004 | Ohmi et al. |
| 6,838,114 B2 | 1/2005 | Carpenter et al. |
| 6,845,734 B2 | 1/2005 | Carpenter et al. |
| 6,849,131 B2 | 2/2005 | Chen et al. |
| 6,858,264 B2 | 2/2005 | Dando et al. |
| 6,861,356 B2 | 3/2005 | Matsuse et al. |
| 6,881,295 B2 | 4/2005 | Nagakura et al. |

| | | |
|---|---|---|
| 6,887,521 B2 | 5/2005 | Basceri |
| 6,905,547 B1 | 6/2005 | Londergan et al. |
| 6,905,549 B2 | 6/2005 | Okuda et al. |
| 6,966,936 B2 | 11/2005 | Yamasaki et al. |
| 6,991,684 B2 | 1/2006 | Kannan et al. |
| 7,022,184 B2 | 4/2006 | Van Wijck |
| 7,056,806 B2 | 6/2006 | Basceri et al. |
| 7,086,410 B2 | 8/2006 | Chouno et al. |
| 7,153,396 B2 | 12/2006 | Genser et al. |
| 2001/0001952 A1 | 5/2001 | Nishizawa et al. |
| 2001/0012697 A1 | 8/2001 | Mikata |
| 2001/0020447 A1 | 9/2001 | Murugesh et al. |
| 2001/0050267 A1 | 12/2001 | Hwang et al. |
| 2001/0054484 A1 | 12/2001 | Komino |
| 2002/0000202 A1 | 1/2002 | Yuda et al. |
| 2002/0007790 A1* | 1/2002 | Park ............................ 118/715 |
| 2002/0016044 A1 | 2/2002 | Dreybrodt et al. |
| 2002/0042205 A1 | 4/2002 | McMillin et al. |
| 2002/0088547 A1 | 7/2002 | Tomoyasu et al. |
| 2002/0132374 A1 | 9/2002 | Basceri et al. |
| 2002/0185067 A1 | 12/2002 | Upham |
| 2002/0195145 A1 | 12/2002 | Lowery et al. |
| 2002/0195201 A1 | 12/2002 | Beer et al. |
| 2003/0031794 A1 | 2/2003 | Tada et al. |
| 2003/0049372 A1 | 3/2003 | Cook et al. |
| 2003/0094903 A1 | 5/2003 | Tao et al. |
| 2003/0098372 A1 | 5/2003 | Kim |
| 2003/0185979 A1 | 10/2003 | Nelson |
| 2003/0213435 A1 | 11/2003 | Okuda et al. |
| 2003/0232892 A1 | 12/2003 | Guerra-Santos et al. |
| 2004/0000270 A1 | 1/2004 | Carpenter et al. |
| 2004/0007188 A1 | 1/2004 | Burkhart et al. |
| 2004/0025786 A1 | 2/2004 | Kontani et al. |
| 2004/0089240 A1 | 5/2004 | Dando et al. |
| 2004/0094095 A1 | 5/2004 | Huang et al. |
| 2004/0154538 A1 | 8/2004 | Carpenter et al. |
| 2004/0226516 A1 | 11/2004 | Daniel et al. |
| 2004/0238123 A1 | 12/2004 | Becknell et al. |
| 2005/0016956 A1 | 1/2005 | Liu et al. |
| 2005/0028734 A1 | 2/2005 | Carpenter et al. |
| 2005/0045102 A1 | 3/2005 | Zheng et al. |
| 2005/0048742 A1 | 3/2005 | Dip et al. |
| 2005/0061243 A1 | 3/2005 | Sarigiannis et al. |
| 2005/0081786 A1 | 4/2005 | Kubista et al. |
| 2005/0087130 A1 | 4/2005 | Derderian |
| 2005/0087132 A1 | 4/2005 | Dickey et al. |
| 2005/0087302 A1 | 4/2005 | Mardian et al. |
| 2005/0120954 A1 | 6/2005 | Carpenter et el. |
| 2005/0126489 A1 | 6/2005 | Beaman et al. |
| 2005/0133161 A1 | 6/2005 | Carpenter et al. |
| 2005/0145337 A1 | 7/2005 | Derderian et al. |
| 2005/0164466 A1 | 7/2005 | Zheng et al. |
| 2005/0217575 A1 | 10/2005 | Gealy et al. |
| 2005/0217582 A1 | 10/2005 | Kim et al. |
| 2005/0249873 A1 | 11/2005 | Sarigiannis et al. |
| 2005/0249887 A1 | 11/2005 | Dando et al. |
| 2005/0268856 A1 | 12/2005 | Miller et al. |
| 2006/0115957 A1 | 6/2006 | Basceri et al. |
| 2006/0121689 A1 | 6/2006 | Basceri et al. |
| 2006/0134345 A1 | 6/2006 | Rueger et al. |
| 2006/0165873 A1 | 7/2006 | Rueger et al. |
| 2006/0198955 A1 | 9/2006 | Zheng et al. |
| 2006/0204649 A1 | 9/2006 | Beaman et al. |
| 2006/0205187 A1 | 9/2006 | Zheng et al. |
| 2006/0213440 A1 | 9/2006 | Zheng et al. |
| 2006/0237138 A1 | 10/2006 | Qin |

FOREIGN PATENT DOCUMENTS

| | | |
|---|---|---|
| JP | 62263629 | 11/1987 |
| JP | 63020490 | 1/1988 |
| JP | 63111177 | 5/1988 |
| JP | 63234198 | 9/1988 |
| JP | 63-256460 A | 10/1988 |
| JP | 6481311 | 3/1989 |
| JP | 1-273991 A | 11/1989 |
| JP | 03174717 | 7/1991 |
| JP | 4-100533 A | 4/1992 |
| JP | 6054443 | 2/1994 |
| JP | 6-151558 A | 5/1994 |
| JP | 06201539 | 7/1994 |
| JP | 06202372 | 7/1994 |
| JP | 6-342785 A | 12/1994 |
| JP | 8-034678 A | 2/1996 |
| JP | 9-82650 A | 3/1997 |
| JP | 10008255 | 1/1998 |
| JP | 10-223419 A | 8/1998 |
| JP | 2001-82682 A | 3/2001 |
| JP | 2001-261375 A | 9/2001 |
| KR | 2005112371 | 11/2005 |
| WO | WO-0132966 | 5/2001 |

OTHER PUBLICATIONS

Bardell, R.L., et al., "Designing High-Performance Micro-Pumps Based on No-Moving-Parts Valves", DSC-vol. 62/HTD-vol. 354, Microelectromechanical Systems (MEMS) ASME 1997, pp. 47-53.

EMCO Flow Systems, "Mach One Mass Flow Controllers", 1 page, retrieved from the Internet on Nov. 7, 2003, <http://emcoflow.com/mach-one.htm>.

EMCO Flow Systems, Mach One Mass Flow Controllers product Brochure, 6 pages, retrieved from the Internet o Nov. 7, 2003, <http://www.emcoflow.com/literarture/brochures_product_sheets/mach_one_brochure_2_01.pdf>.

Engelke, F. et al., "Determination of Phenylthiohydantoin-Amino Acids by Two-Step Laser Desorption/Multiphoton Ionization," Anal. Chem., vol. 59, pp. 909-912, 1987.

Fitch, J.S., et al., "Pressure-Based Mass-Flow Control Using Thermopneumatically-Actuated Microvalves," Proceedings, Sensors and Actuators Workshop, pp. 162-165 (Transducers Research Foundation, Cleveland, OH, 1998).

SemiZone, "EMCO Flow Systems Granted Patent for the Mach One Mass Flow Controller for the Semiconductor Industry (Jun. 28, 2001)", 2 pages, retrieved from the Internet on Nov. 7, 2003, <http://www.semizone.com/news/item?news_item_id=100223>.

Tokyo Electron Limited, Plasma Process System Trias® SPA, 1 apge, retrieved from the Internet on Jul. 16, 2003, <http://www.tel.com/eng/products/spe/sdtriasspa.htm>.

MKS Instruments, Data Sheet, Downstream Plasma Source, Type AX7610, 4 pages, Dec. 2002, <http://www.mksinst.com/docs/UR/ASTEXax7610DS.pdf>.

MKS Instruments, ASTeX® Microwave Plasma Sources and Subsystems, 1 page, retrieved from the Internet on Nov. 19, 2004, <http://www.mksinst.com/PRG2.html>.

* cited by examiner

REACTORS WITH ISOLATED GAS CONNECTORS AND METHODS FOR DEPOSITING MATERIALS ONTO MICRO-DEVICE WORKPIECES

CROSS-REFERENCE TO RELATED APPLICATION

This application is a divisional of U.S. application Ser. No. 10/365,085, entitled "REACTORS WITH ISOLATED GAS CONNECTORS AND METHODS FOR DEPOSITING MATERIALS ONTO MICRO-DEVICE WORKPIECES," filed Feb. 11, 2003 now U.S. Pat No. 6,926,775, which is incorporated herein by reference in its entirety.

TECHNICAL FIELD

The present invention is related to reactors with isolated gas connectors and methods for depositing materials in thin film deposition processes used in the manufacturing of micro-devices.

BACKGROUND

Thin film deposition techniques are widely used in the manufacturing of micro-devices to form a coating on a workpiece that closely conforms to the surface topography. The size of the individual components in the devices is constantly decreasing, and the number of layers in the devices is increasing. As a result, the density of components and the aspect ratios of depressions (e.g., the ratio of the depth to the size of the opening) are increasing. The size of workpieces is also increasing to provide more real estate for forming more dies on a single workpiece. Many fabricators, for example, are transitioning from 200 mm to 300 mm workpieces, and even larger workpieces will likely be used in the future. Thin film deposition techniques accordingly strive to produce highly uniform conformal layers that cover the sidewalls, bottoms, and corners in deep depressions that have very small openings.

One widely used thin film deposition technique is Chemical Vapor Deposition (CVD). In a CVD system, one or more precursors that are capable of reacting to form a solid thin film are mixed in a gas or vapor state, and then the precursor mixture is presented to the surface of the workpiece. The surface of the workpiece catalyzes the reaction between the precursors to form a thin solid film at the workpiece surface. A common way to catalyze the reaction at the surface of the workpiece is to heat the workpiece to a temperature that causes the reaction.

Although CVD techniques are useful in many applications, they also have several drawbacks. For example, if the precursors are not highly reactive, then it is often necessary to heat the workpiece to a temperature that catalyzes the reaction between the precursors. Heating the workpiece, however, can be detrimental to the structures and other materials already formed on the workpiece. Implanted or doped materials, for example, can migrate within the silicon substrate at higher temperatures. On the other hand, if more reactive precursors are used so that the workpiece temperature can be lower, then reactions may occur prematurely in the gas phase before reaching the substrate. This is undesirable because the film quality and uniformity may suffer, and also because it limits the types of precursors that can be used.

One conventional system to prevent premature reactions injects the precursors into the reaction chamber through separate ports. For example, each port of a showerhead can be coupled to a dedicated gas line for a single gas. Systems that present the precursors through dedicated ports proximate to the surface of the workpiece, however, may not sufficiently mix the precursors. Accordingly, the precursors may not react properly to form a uniform, thin solid film on the workpiece surface. Furthermore, conventional systems also have a jetting effect that produces a higher deposition rate directly below the ports. Thus, conventional CVD systems may not be appropriate for many thin film deposition applications.

Atomic Layer Deposition (ALD) is another thin film deposition technique. FIGS. 1A and 1B schematically illustrate the basic operation of ALD processes. Referring to FIG. 1A, a layer of gas molecules $A_x$ coats the surface of a workpiece W. The layer of $A_x$ molecules is formed by exposing the workpiece W to a precursor gas containing $A_x$ molecules, and then purging the chamber with a purge gas to remove excess $A_x$ molecules. This process can form a monolayer of $A_x$ molecules on the surface of the workpiece W because the $A_x$ molecules at the surface are held in place during the purge cycle by physical adsorption forces at moderate temperatures or chemisorption forces at higher temperatures. The layer of $A_x$ molecules is then exposed to another precursor gas containing $B_y$ molecules. The $A_x$ molecules react with the $B_y$ molecules to form an extremely thin layer of solid material on the workpiece W. The chamber is then purged again with a purge gas to remove excess $B_y$ molecules.

FIG. 2 illustrates the stages of one cycle for forming a thin solid layer using ALD techniques. A typical cycle includes (a) exposing the workpiece to the first precursor $A_x$, (b) purging excess $A_x$ molecules, (c) exposing the workpiece to the second precursor $B_y$, and then (d) purging excess $B_y$ molecules. In actual processing, several cycles are repeated to build a thin film on a workpiece having the desired thickness. For example, each cycle may form a layer having a thickness of approximately 0.5-1.0 Å, and thus it takes approximately 60-120 cycles to form a solid layer having a thickness of approximately 60 Å.

FIG. 3 schematically illustrates an ALD reactor 10 having a reaction chamber 20 coupled to a gas supply 30 and a vacuum 40. The reactor 10 also includes a lid 80 coupled to the reaction chamber 20, a heater 50 that supports the workpiece W, and a gas distributor 60 in the reaction chamber 20. The gas distributor 60 includes a plenum 62 operatively coupled to the gas supply 30 and a distributor plate 70 having a plurality of holes 72. In operation, the heater 50 heats the workpiece W to a desired temperature, and the gas supply 30 selectively injects the first precursor $A_x$, the purge gas, and the second precursor $B_y$ as shown above in FIG. 2. The vacuum 40 maintains a negative pressure in the chamber to draw the gases from the gas distributor 60 across the workpiece W and then through an outlet of the reaction chamber 20.

One drawback of ALD and CVD processing is that it is difficult to control the uniformity of the deposited films over a long period of time. For example, the individual precursors and/or the resulting material that is formed by the reaction between the precursor gases may build up on the components of the reaction chamber 20. Additionally, when the adsorption of the first precursor and/or the second precursor reaches a saturation point, the precursors will then begin to desorp into the gas flows. Such adsorption and desorption of the precursors continually changes the concentration of the first and second precursors in the chamber, which often adversely affects the quality of the film deposited onto the workpieces. As a result, the ALD and CVD reactors may need to be taken off-line for cleaning, which is time-consuming and reduces the throughput of a fabrication process. Therefore, there is a need to provide better control of the adsorption and desorption rates to achieve more consistent results throughout a run of workpieces and reduce downtime of ALD and CVD reactors.

SUMMARY

The present invention is directed toward reactors for depositing materials onto micro-device workpieces, systems that include such reactors, and methods for depositing material onto micro-device workpieces. In one embodiment, a reactor for depositing materials onto a micro-device workpiece includes a reaction chamber, a passageway, and a door assembly. The reaction chamber includes a gas distributor configured to provide a flow of gas(es) to a micro-device workpiece on a workpiece holder. The passageway has a first end open to the reaction chamber and a second end apart from the reaction chamber. The passageway is configured to provide ingression to and egression from the chamber for a micro-device workpiece being handled by a robotic system. The door assembly is configured to sealably close a door at the second end of the passageway. The reactor further includes a gas conditioning system positioned at least proximate to the door; the gas conditioning system maintains a desired concentration and phase of gas constituents in the passageway to inhibit adsorption and/or desorption of the precursors in the second end of the passageway.

The gas conditioning system can have various embodiments. In one embodiment, a plurality of flow ports are positioned in the door and a secondary gas is flowed through the flow ports into the passageway. The secondary gas, for example, can be a purge gas. The flow of the secondary gas through the passageway inhibits undesirable adsorption or desorption of precursor gas(es) within the passageway area. In another aspect, the flow ports can be configured to flow the secondary gas along a particular vector or create a vortex within the passageway. In another embodiment, the gas conditioning system can include a heating element in the door to control the temperature of the second end of the passageway area. The heating element maintains the second end of the passageway at a desired temperature. The heating element can be any device that heats the passageway area, such as an electrical radiator, a liquid radiator, a Peltier cell, or a superheated inert gas.

In yet another embodiment, the gas conditioning system can include a plurality of flow ports proximate to the second end of the passageway. The flow ports are open to the passageway to provide a flow of a secondary gas through the passageway. In still another embodiment, the gas conditioning system can include a heating element located proximate to the second end of the passageway. Additional embodiments of the gas conditioning system can include using both a plurality of flow ports and a heating element in the door assembly and/or proximate to the second end of the passageway. In still another embodiment, only a single flow port for the secondary gas may be positioned in the door and/or the second end of the passageway.

The apparatus can be used to perform several CVD, ALD, or other methods for depositing materials onto a micro-device workpiece. In one embodiment, a method for inhibiting an undesirable concentration and/or phase of gas constituents from being in the passageway includes flowing a secondary gas through the passageway area. In a further aspect of this embodiment, the method can include heating the second end of the passageway to a desired temperature in addition to or in lieu of flowing a secondary gas through the passageway. Additional embodiments of this method include flowing a heated secondary gas through the passageway.

DETAILED DESCRIPTION

The following disclosure describes several embodiments of reactors for depositing material onto micro-device workpieces, systems including such reactors, and methods for depositing materials onto micro-device workpieces. Many specific details of the invention are described below with reference to depositing materials onto micro-device workpieces. The term "micro-device workpiece" is used throughout to include substrates upon which and/or in which microelectronic devices, micromechanical devices, data storage elements, read/write components, and other features are fabricated. For example, micro-device workpieces can be semiconductor wafers, such as silicon or gallium arsenide wafers, glass substrates, insulative substrates, and many other types of materials. The term "gas" is used throughout to include any form of matter that has no fixed shape and will conform in volume to the space available, which specifically includes vapors (i.e., a gas having a temperature less than the critical temperature so that it may be liquefied or solidified by compression at a constant temperature). Several embodiments in accordance with the invention are set forth in FIGS. 4-10 and the following text to provide a thorough understanding of particular embodiments of the invention. It is to be understood, however, that the invention may have additional embodiments, or that the invention may be practiced without several of the details of the embodiments shown in FIGS. 4-10.

Figure 1A:
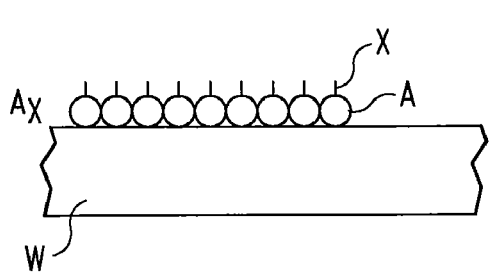
FIGS. 1A and 1B are schematic cross-sectional views of stages in ALD processing in accordance with the prior art.
Figure 1B:
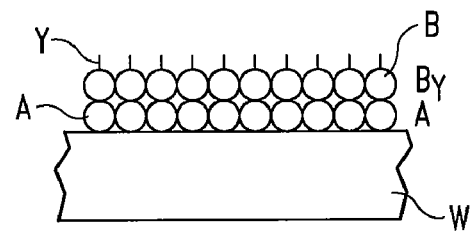
Figure 2:
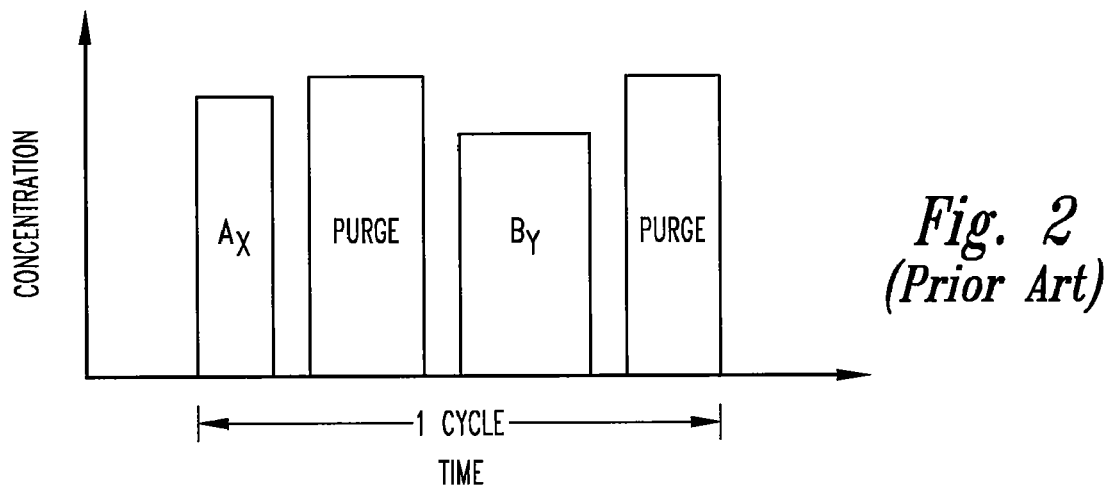
FIG. 2 is a graph illustrating a cycle for forming a layer using ALD techniques in accordance with the prior art.
Figure 3:
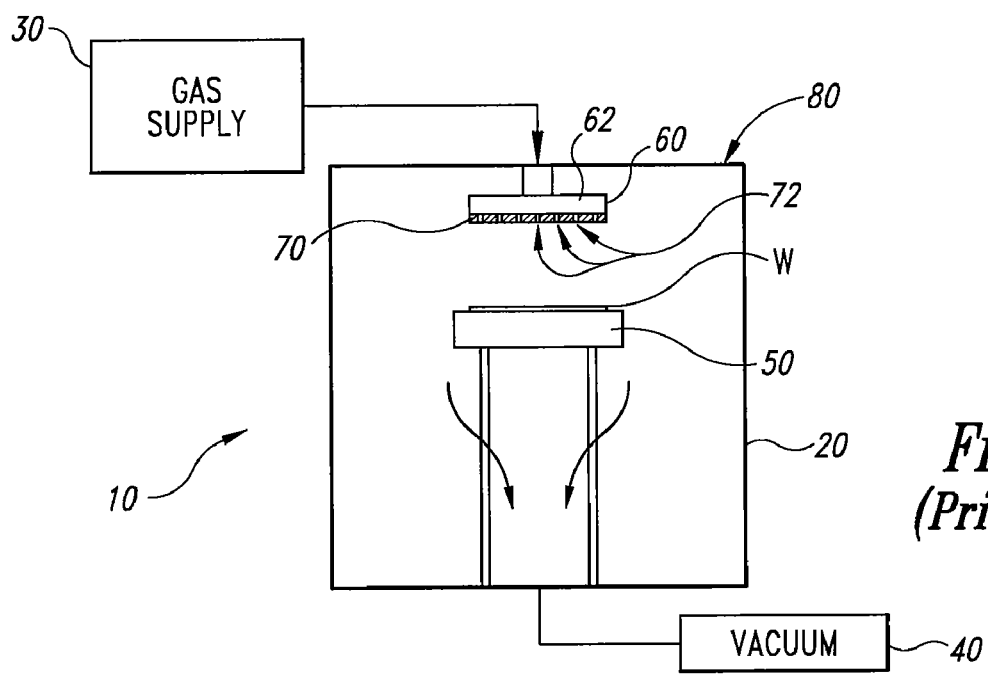
FIG. 3 is a schematic representation of a system including a reactor for depositing a material onto a micro-device workpiece in accordance with the prior art.
Figure 4:
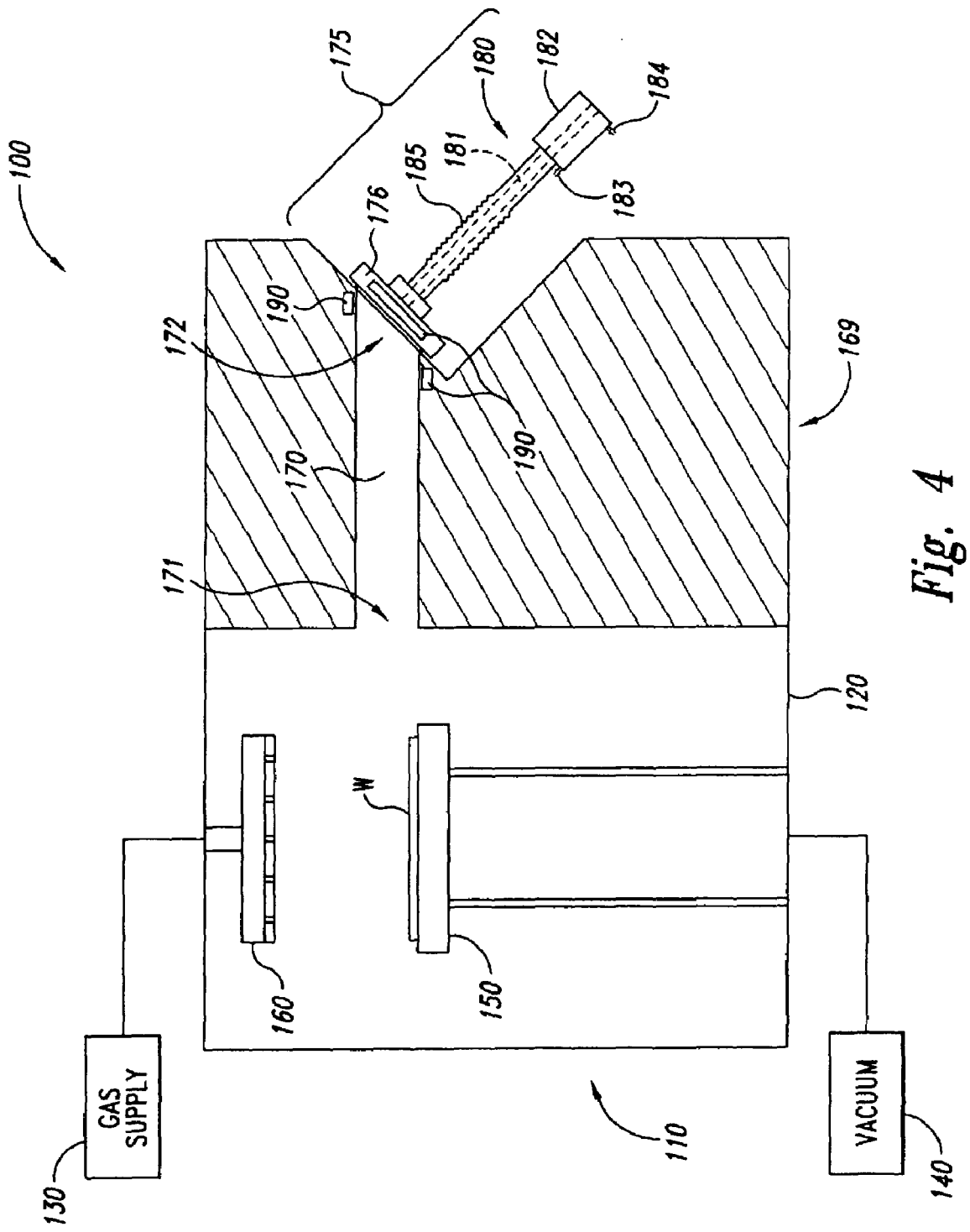
FIG. 4 is a schematic representation of a reactor system for depositing material onto a micro-device workpiece in accordance with one embodiment of the invention.

FIG. 4 is a schematic representation of a system 100 for depositing material onto a micro-device workpiece W in accordance with one embodiment of the invention. The system 100 includes a reactor 110 having a reaction chamber 120 coupled to a gas supply 130 and a vacuum 140. The reactor 110 also includes a gas distributor 160 coupled to the gas supply 130 and a workpiece holder 150 that supports the workpiece W. The gas distributor 160 is positioned over the workpiece holder 150 to deliver gas(es) to the workpiece W. The workpiece holder 150 can be a heater or heat sink that holds the workpiece W at a desired temperature. In other embodiments, however, the workpiece holder 150 may not be heated. The reaction chamber 120 is coupled to the vacuum 140 to draw gases from the gas distributor 160 across the workpiece W and then out of the reaction chamber 120.

The system 100 further includes an access chamber 169 that includes a passageway 170 configured to provide ingression to and egression from the reaction chamber 120 for the workpiece W. The passageway 170 includes a first end 171 open to the reaction chamber 120 and a second end 172 apart from the first end 171. When the second end 172 of the passageway 170 is open, a robotic device can pass a workpiece W through the passageway 170 and place the workpiece on the workpiece holder 150. After processing, the robotic device removes the workpiece W from the workpiece holder 150 and carries the workpiece back through the passageway 170.

The system 100 further includes a door assembly 175 located at the second end 172 of the passageway 170. The door assembly 175 includes a door 176 and an actuator assembly 180 to move the door 176 between a first position to open the passageway 172 and a second position to close the passageway 172. The actuator assembly 180 includes an actuator shaft 181, an actuator 182 that receives a portion of the actuator shaft 181, a first fluid inlet/outlet 183, and a second fluid inlet/outlet 184. The actuator assembly 180 can further include a bellows 185 that surrounds a portion of the shaft 181. One end of the shaft 181 carries the door 176, and the other end of the shaft 181 includes a piston head in the actuator 182. In operation, pressurized air is injected into the first fluid inlet/outlet 183 while exhaust air flows through the second inlet/outlet 184 to disengage the door 176 from the second end 172 of the passageway 170. Conversely, pressurized air is injected through the second fluid inlet/outlet 184 while exhaust air flows through the first inlet/outlet 183 to engage the door 176 with the second end 172 of the passageway 170. The door 176 seals the passageway 170 in the closed or second position for processing the workpiece W in the reaction chamber 120.

The system 100 further includes a gas conditioning system 190 at least proximate to the second end 172 of the passageway 170. The gas conditioning system 190 can be a component carried by the door 176 and/or the access chamber 169 at the second end 172 of the passageway 170. The gas conditioning system 190 is configured to maintain or control the desired concentration and/or phase of the reactive constituents within the passageway 170. As such, several embodiments of the gas conditioning system 190 are expected to mitigate or inhibit adsorption and/or desorption of constituent gases within the passageway that can reduce the quality of the film deposited on the workpiece W. Several embodiments of gas conditioning systems 190 are described in more detail below with reference to FIGS. 5-10.

Figure 5:
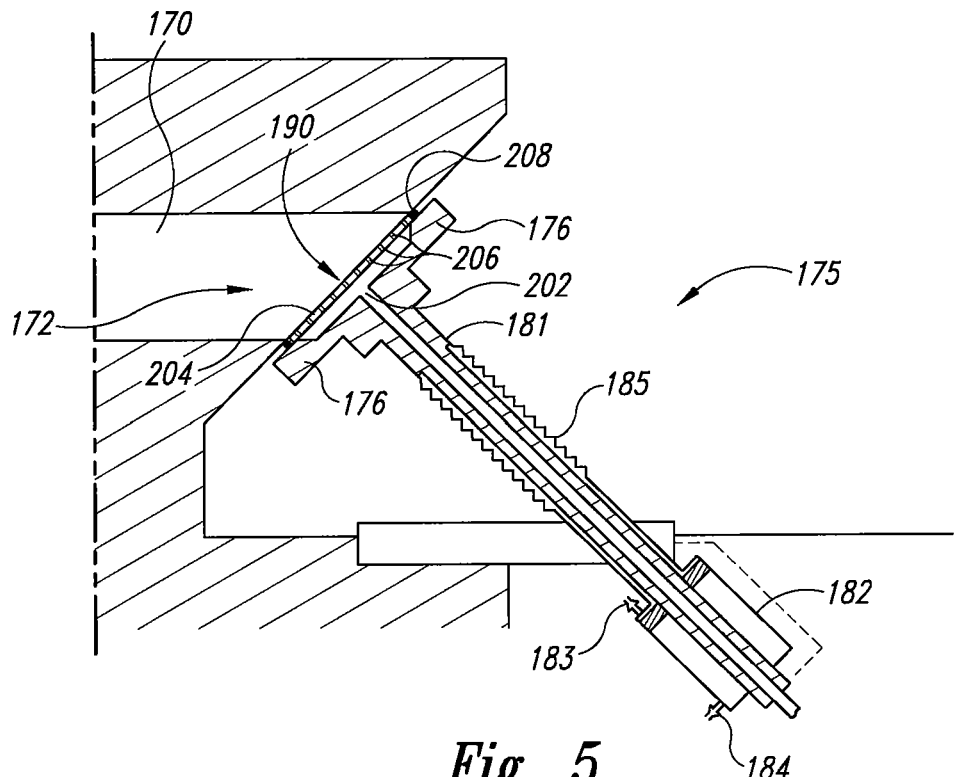
FIG. 5 is a cross-sectional view of a gas conditioning system used in a reactor system for depositing material onto a micro-device workpiece in accordance with one embodiment of the invention.

FIG. 5 is a cross-sectional view of an embodiment of a gas conditioning system 190 in accordance with an embodiment of the invention. In this embodiment, the gas conditioning system 190 includes a secondary gas passage 202 in the door 176 and the actuator shaft 181. The gas conditioning system 190 also includes a plate 204 attached to the door 176. The plate 204 includes a plurality of flow ports 206. A seal 208 can extend around the plate 204 to seal the door 176 to the second end 172 of the passageway 170. In operation, the door 176 is sealed to the second end of the passageway, and then a secondary gas flows through the secondary gas passage 202 and the flow ports 206. The flow ports 206 can be configured to project the secondary gas flow along a vector parallel to the passageway 170. In other embodiments, the flow ports 206 can be configured to direct the flow of the secondary gas along a different vector at an angle to the passageway 170 or to create a vortex within the passageway 170.

The secondary gas flowing through the flow ports 206 can be a purge gas. For example, the purge gas can be the same gas that is used during the purge cycle for ALD or CVD processing. In other embodiments, the secondary gas can be a different type of purge gas. The secondary gas can flow continuously during a deposition cycle, or it can flow for only a portion of the deposition cycle. For example, in ALD processing, a secondary gas can flow only during the purge cycle in certain embodiments, or it can flow during the pulses of one or more precursor gases in addition to or in lieu of flowing during the purge cycle. In CVD processing, the secondary gas can flow periodically or continuously during a deposition cycle or between deposition cycles.

One advantage of the embodiment illustrated in FIG. 5 is that the flow of secondary gas in the passageway 170 inhibits adsorption and/or desorption of the precursor gases in the passageway 170. The present inventors have discovered that the precursors are particularly susceptible to adsorp to the access chamber because the passageway 170 can entrap some of the precursor molecules and it may not be at the same temperature as the reaction chamber 120. The flow of secondary gas is expected to "scrub" or remove precursors from the passageway before they can adsorp to the surface of the door 176 or the access chamber 169. The flow of secondary gas through the passageway 170, therefore, should provide better control of the concentration and phase of precursors in the reaction chamber that will result in higher quality films.

Figure 6:
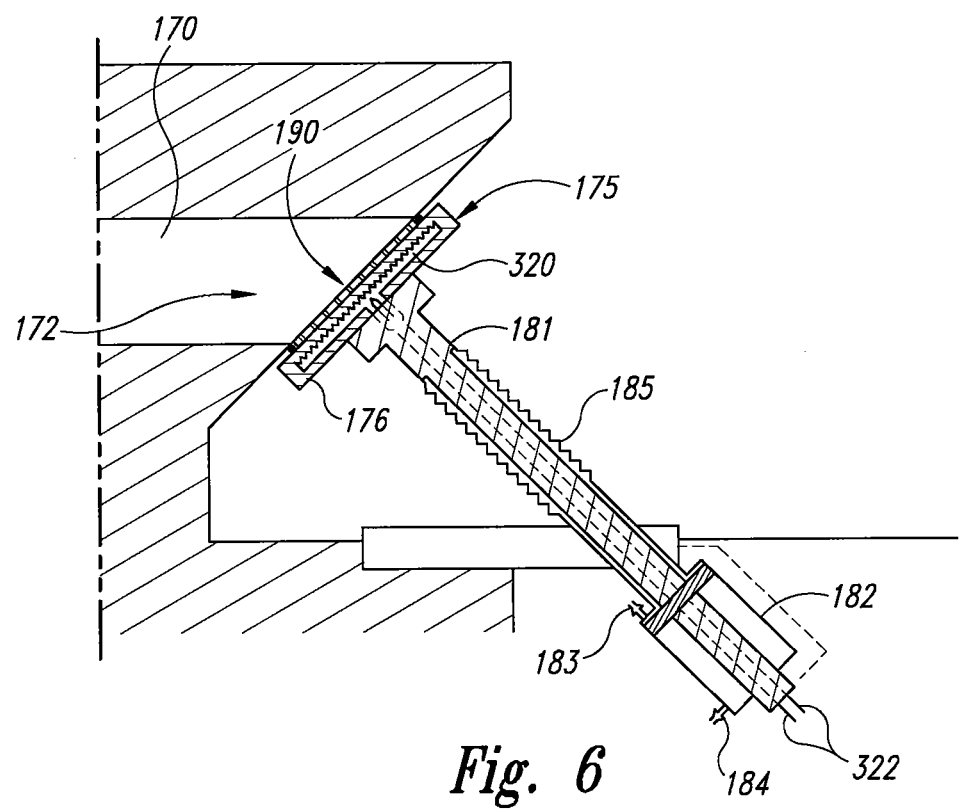
FIG. 6 is a cross-sectional view of a gas conditioning system used in a reactor system for depositing material onto a micro-device workpiece in accordance with another embodiment of the invention.

FIG. 6 is a cross-sectional view illustrating another embodiment of the gas conditioning system 190 in accordance with the invention. In this embodiment, the gas conditioning system 190 includes a temperature control system 320 carried by the door 176. The temperature control system 320 can be an electrical element, a fluid passageway for a heated fluid, an infrared element, or another type of device for maintaining a desired temperature at the second end 172 of the passageway 170. The temperature control system 320 can further include leads or fluid lines 322 that run through the shaft 181. In operation, the temperature control system 320 typically heats the door 176 to maintain a temperature at the second end 172 of the passageway 170 at which the precursor gases do not adsorp to the walls of the passageway 170 or the door 176. One advantage of the particular embodiment of the gas conditioning system 190 shown in FIG. 6 is that by precisely controlling the temperature at the second end 172 of the passageway 170, adsorption and/or desorption of gases in the passageway 170 is reduced in a manner that is expected to provide higher quality films on workpieces.

Figure 7:
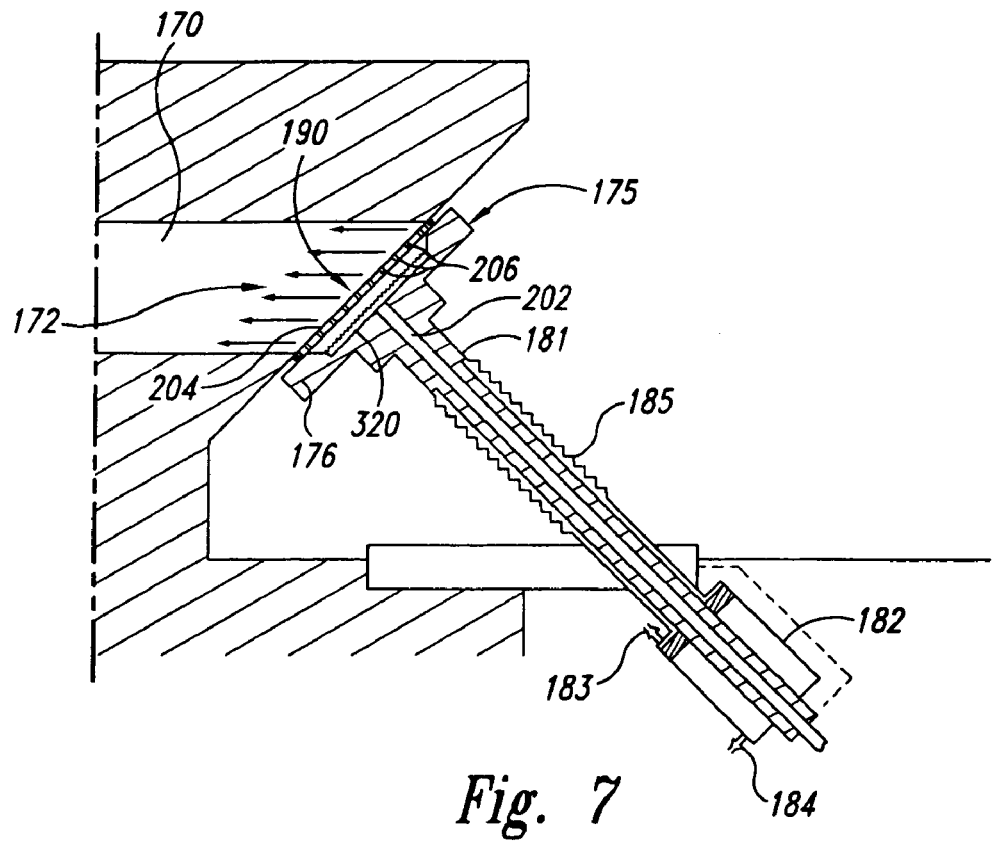
FIG. 7 is a cross-sectional view of a gas conditioning system used in a reactor system for depositing material onto a micro-device workpiece in accordance with another embodiment of the invention.

FIG. 7 illustrates another embodiment of the gas conditioning system 190 including the secondary gas passage 202, the plate 204 with the flow ports 206, and the temperature control system 320 in the door 176. The flow ports 206 and the temperature control system 320 can be similar to the components described above with reference to FIGS. 5 and 6. In the embodiment shown in FIG. 7, however, these two features operate together to maintain a desired concentration and phase of gas constituents in the passageway 170. As with the embodiments show in FIGS. 5 and 6, this embodiment is expected to (a) mitigate contamination of the workpiece W (FIG. 4) as it passes through the passageway 170 and (b) enhance the quality of the film deposited on the workpiece.

Figure 8:
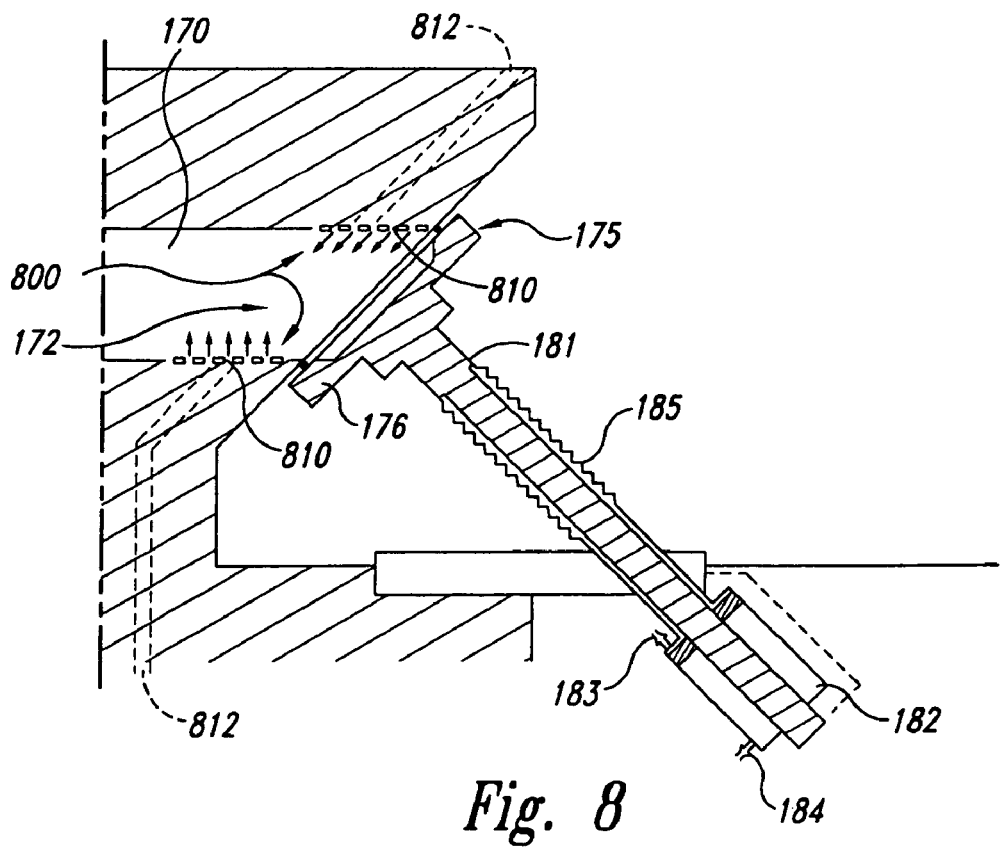
FIG. 8 is a cross-sectional view of a gas conditioning system used in a reactor system for depositing material onto a micro-device workpiece in accordance with another embodiment of the invention.
Figure 9:
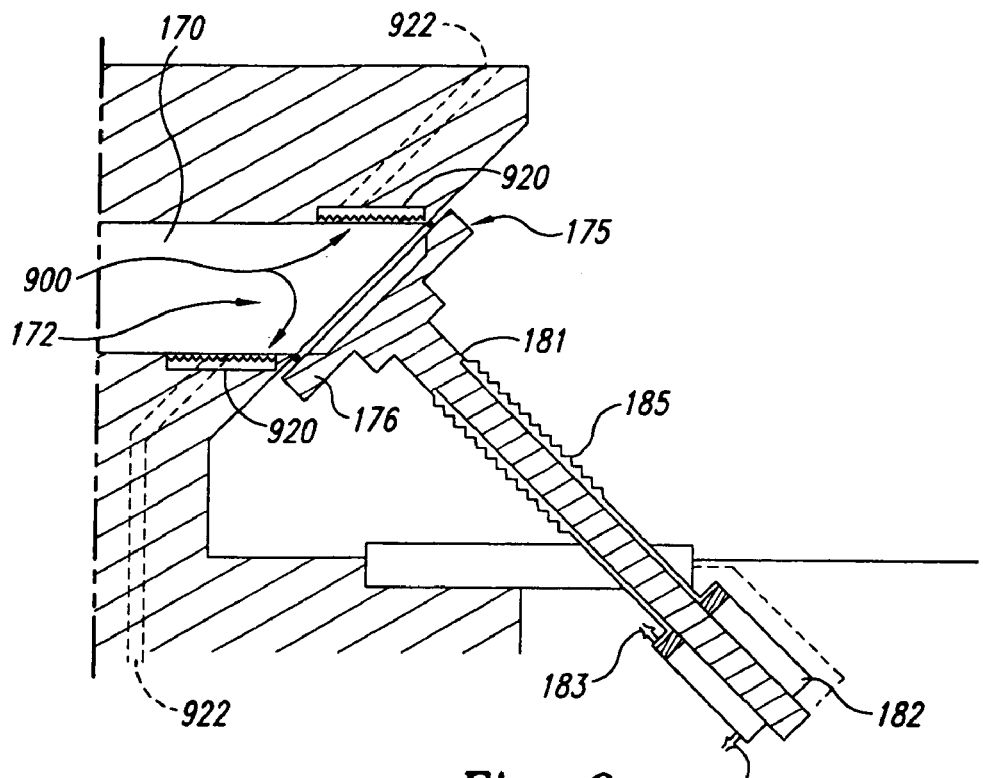
FIG. 9 is a cross-sectional view of a gas conditioning system used in a reactor system for depositing material onto a micro-device workpiece in accordance with another embodiment of the invention.
Figure 10:
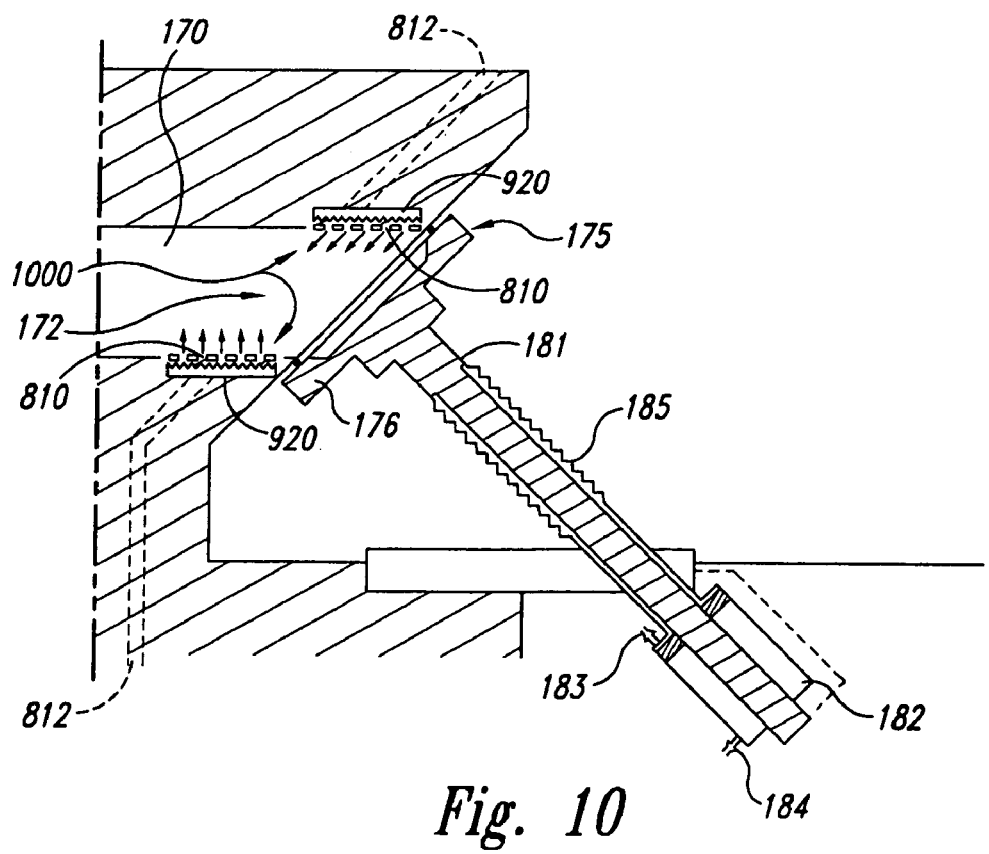
FIG. 10 is a cross-sectional view of a gas conditioning system used in a reactor system for depositing material onto a micro-device workpiece in accordance with another embodiment of the invention.

FIGS. 8-10 are cross-sectional views illustrating additional embodiments of reactors with gas conditioning systems. Like reference numbers refer to like components in FIGS. 5-7 and 8-10, and thus specific details of components described above are not repeated.

FIG. 8 is a cross-sectional view of a gas conditioning system 800 including a plurality of flow ports 810 in the wall of the passageway 170 and a secondary gas passage 812. A secondary gas passes through the secondary gas passage 812 and flows through the flow ports 810 into the second end 172 of the passageway 170. FIG. 9 is a cross-sectional view of another embodiment of a gas conditioning system 900 including a temperature control system 920 in or at the wall of the passageway 170 rather than the door 176. In this embodiment, the temperature control system 920 is a heating element positioned in the wall of the passageway 170 near the second end 172 of the passageway 170. The temperature control system 920 can be an electrical or fluid system that has leads or fluid lines 922. FIG. 10 is a cross-sectional view of a gas control system 1000 that includes a temperature control system 920 and flow ports 810 in or at the wall near the second end 172 of the passageway 170. The flow ports 810 and temperature control system 920 of this embodiment can operate as described above with reference to embodiments shown in FIGS. 8 and 9.

From the foregoing, it will be appreciated that specific embodiments of the invention have been described herein for purposes of illustration, but that various modifications may be made without deviating from the spirit and scope of the invention. For example, any of the embodiments shown in FIGS. 5-7 can be combined with one or more of those shown in FIGS. 8-10. As such, the gas conditioning system can have one heating element or a set of flow ports in the door and/or another heating element or another set of flow ports in the wall at the second end of the passageway. Accordingly, the invention is not limited except as by the appended claims.

We claim:

1. A method of fabricating a layer on a micro-device workpiece, comprising:
   inserting a workpiece through a passageway and into a reaction chamber, wherein the passageway includes a duct having a first end open to the chamber and a second end apart from the chamber, and wherein the first end remains open to the chamber while processing the workpiece;
   reacting a first precursor gas and a second precursor gas in the reaction chamber to form a layer of material on a workpiece; and
   inhibiting an undesirable concentration and/or phase of the first precursor and/or the second precursor from being in the passageway with a gas conditioning system carried by a door assembly at a second end of the passageway, the gas conditioning system including at least one of (a) a flow port through which a secondary gas flows directly into the passageway, and (b) a heating element.

2. The method of claim 1, further comprising:
   flowing the first precursor gas through the reaction chamber to deposit the first precursor onto the micro-device workpiece;
   flowing a first purge gas through the reaction chamber to purge excess amounts of the first precursor;
   flowing the second precursor gas through the reaction chamber to deposit the second precursor onto the micro-device workpiece;
   flowing the purge gas through the reaction chamber to purge excess amounts of the second precursor; and
   providing a flow of a secondary gas through the passageway during at least one of the flowing procedures.

3. The method of claim 1, further comprising mixing the first precursor gas and the second precursor gas in a mixing zone exposed to and over the micro-device workpiece.

4. The method of claim 1 wherein the reacting step is repeated until a layer having the desired thickness is formed on the workpiece.

5. The method of claim 1 wherein inhibiting an undesirable concentration of precursor gases in the passageway comprises heating the passageway using the heating element carried by the door assembly.

6. The method of claim 1 wherein inhibiting an undesirable concentration of precursor gases in the passageway comprises flowing a secondary gas through the flow port carried by the door assembly and through the passageway toward the chamber.

7. A method of fabricating a layer on a micro-device workpiece, comprising:
   inserting a workpiece through a passageway and into a reaction chamber, wherein the passageway includes a duct having a first end open to the chamber and a second end apart from the chamber, and wherein the first end remains open to the chamber while processing the workpiece;
   reacting a first precursor gas and a second precursor gas in the reaction chamber to form a layer of material on a workpiece; and
   heating the passageway with a heating element carried by a door at the second end of the passageway to inhibit an undesirable concentration and/or phase of the first precursor and/or the second precursor from being in the passageway.

8. The method of claim 7 wherein heating the passageway occurs before reacting the first and second precursor gases in the reaction chamber.

9. The method of claim 7 wherein heating the passageway occurs simultaneously with reacting the first and second precursor gases in the reaction chamber.

10. The method of claim 7 wherein heating the passageway comprises using at least one of an electrical heater element, heated fluid loop, Peltier cell, and superheated inert gas.

11. The method of claim 7 wherein the door is movable between a first position and a second position, the door being configured to seal the second end of the passageway in the second position, and wherein:
   heating the passageway with a heating element carried by the door comprises heating the passageway with the heating element when the door is in the second position.

12. A method of fabricating a layer on a micro-device workpiece, comprising:
   inserting a workpiece through a passageway and into a reaction chamber, wherein the passageway includes a duct having a first end open to the chamber and a second end apart from the chamber, and wherein the first end remains open to the chamber while processing the workpiece;
   reacting a first precursor gas and a second precursor gas in the reaction chamber to form a layer of material on a workpiece; and
   flowing a secondary gas directly into the passageway through a flow port at a second end of the passageway to inhibit an undesirable concentration and/or phase of the first precursor and/or the second precursor from being in the passageway.

13. The method of claim 12 wherein flowing a secondary gas occurs before reacting the first and second precursor gases in the reaction chamber.

14. The method of claim 12 wherein flowing a secondary gas occurs simultaneously with reacting the first and second precursor gases in the reaction chamber.

15. The method of claim 12 wherein flowing a secondary gas comprises passing the secondary gas through flow ports in a door assembly at the second end of the passageway and directly into the passageway, wherein the door assembly is configured to seal the second end of the passageway.

16. The method of claim 12 wherein flowing a secondary gas comprises passing the secondary gas through flow ports in the passageway, and wherein the secondary gas flows through the duct toward the reaction chamber.

17. The method of claim 12 wherein the secondary gas is heated before being flowed through the passageway.

18. A method of fabricating a layer on a micro-device workpiece, comprising:
    inserting a workpiece through a passageway and into a reaction chamber, wherein the passageway includes a duct having a first end open to the chamber and a second end apart from the chamber, and wherein the first end remains open to the chamber while processing the workpiece;
    reacting a first precursor gas and a second precursor gas in the reaction chamber to form a layer of material on a workpiece;
    heating the passageway with a heating element proximate to the second end of the passageway; and
    flowing a secondary gas into the passageway through a flow port proximate to the second end of the passageway to inhibit an undesirable concentration and/or phase of the first precursor and/or the second precursor from being in the passageway.

19. The method of claim 18, further comprising:
    flowing the first precursor gas through the reaction chamber to deposit the first precursor onto the micro-device workpiece;
    flowing a first purge gas through the reaction chamber to purge excess amounts of the first precursor;
    flowing the second precursor gas through the reaction chamber to deposit the second precursor onto the micro-device workpiece; and
    flowing a second purge gas through the reaction chamber to purge excess amounts of the second precursor.

20. The method of claim 18, further comprising mixing the first precursor gas and the second precursor gas in a mixing zone exposed to and over the micro-device workpiece.

21. The method of claim 18 wherein heating the passageway occurs after flowing the secondary gas through the passageway.

22. The method of claim 18 wherein heating the passageway occurs simultaneously with flowing the secondary gas through the passageway.

23. A method of fabricating a layer on a micro-device workpiece, comprising:
    inserting a workpiece through a passageway and into a reaction chamber, wherein the passageway includes a duct having a first end open to the chamber and a second end apart from the chamber, and wherein the first end remains open to the chamber while processing the workpiece;
    reacting a first precursor gas and a second precursor gas in the reaction chamber to form a layer of material on a workpiece; and
    flowing a heated secondary gas directly into the passageway through a flow port proximate to the second end of the passageway to inhibit an undesirable concentration and/or phase of the first precursor and/or the second precursor from being in the passageway.

* * * * *